United States Patent
Uehara et al.

(10) Patent No.: US 9,393,737 B2
(45) Date of Patent: Jul. 19, 2016

(54) RESIN MOLD FOR NANOIMPRINTING

(75) Inventors: Satoshi Uehara, Sayama (JP); Takahide Mizawa, Sayama (JP)

(73) Assignee: Soken Chemical & Engineering Co., Ltd., Tokyo (JP)

( * ) Notice: Subject to any disclaimer, the term of this patent is extended or adjusted under 35 U.S.C. 154(b) by 532 days.

(21) Appl. No.: 13/814,298

(22) PCT Filed: Aug. 3, 2011

(86) PCT No.: PCT/JP2011/067765
§ 371 (c)(1),
(2), (4) Date: Feb. 5, 2013

(87) PCT Pub. No.: WO2012/018043
PCT Pub. Date: Feb. 9, 2012

(65) Prior Publication Data
US 2013/0136818 A1    May 30, 2013

(30) Foreign Application Priority Data
Aug. 6, 2010 (JP) .................. 2010-177600

(51) Int. Cl.
*B29C 59/02* (2006.01)
*B29C 33/40* (2006.01)
(Continued)

(52) U.S. Cl.
CPC .................. *B29C 59/02* (2013.01); *B29C 33/40* (2013.01); *B82Y 10/00* (2013.01); *B82Y 40/00* (2013.01); *G03F 7/0002* (2013.01); *B29C 33/38* (2013.01); *B29C 2059/023* (2013.01)

(58) Field of Classification Search
CPC .. B29C 33/38; B29C 33/40; B29C 2059/023; B29C 59/02; G03F 7/0002; B82Y 40/00; B82Y 10/00
USPC ................................................. 425/383, 385
See application file for complete search history.

(56) References Cited

U.S. PATENT DOCUMENTS 5,330,882 A * 7/1994 Kawaguchi et al. .......... 430/327
5,879,809 A * 3/1999 Muramatsu et al. .......... 428/412
(Continued)

FOREIGN PATENT DOCUMENTS

JP   58167606 A   10/1983
JP   59078236 A   5/1984
(Continued)

OTHER PUBLICATIONS

Choi, Philip, Y., "Physiochemical surface interactions of nanoprint lithography resists and imprinted pore membranes", Jan. 29, 2010.
(Continued)

*Primary Examiner* — Seyed Masoud Malekzadeh
(74) *Attorney, Agent, or Firm* — The Webb Law Firm

(57) ABSTRACT

Disclosed is a resin mold for nanoimprinting, which has a resin layer having fine depressions and protrusions formed on the surface, wherein the resin layer is formed from 1 to 49 parts by weight of a silicone-based macromonomer and/or a fluorine-based macromonomer and 99 to 51 parts by weight of at least one polymerizable monomer selected from the group consisting of a (meth)acrylic monomer, a styrene-based monomer, an epoxy-based monomer, an olefin-based monomer and a polycarbonate-based resin-forming monomer. The silicone-based macromonomer and/or the fluorine-based macromonomer has a molecular weight of 600 to 10000 and has, at an end of molecule, a reactive group copolymerizable with the polymerizable monomer, and when the reactive group is copolymerized with the polymerizable group, silicone-based units or fluorine-based units that constitute the macromonomer form side chains on a trunk polymer formed from the polymerizable monomer and the macromonomer.

11 Claims, 3 Drawing Sheets

(51) Int. Cl.
*B82Y 10/00* (2011.01)
*B82Y 40/00* (2011.01)
*G03F 7/00* (2006.01)
*B29C 33/38* (2006.01)

(56) References Cited

U.S. PATENT DOCUMENTS

| | | | |
|---|---|---|---|
| 7,385,006 B2 * | 6/2008 | Ueda et al. | 525/100 |
| 7,420,005 B2 * | 9/2008 | Hojo et al. | 522/81 |
| 7,441,745 B2 * | 10/2008 | Kawaguchi et al. | 249/114.1 |
| 7,767,309 B2 | 8/2010 | Ueno et al. | |
| 2004/0170816 A1 * | 9/2004 | Watanabe et al. | 428/304.4 |
| 2006/0231728 A1 * | 10/2006 | Takamatsu et al. | 249/127 |
| 2007/0228619 A1 | 10/2007 | Kawaguchi et al. | |
| 2009/0253084 A1 * | 10/2009 | Takemura et al. | 430/326 |
| 2011/0008577 A1 * | 1/2011 | Miyake et al. | 428/156 |

FOREIGN PATENT DOCUMENTS

| | | | |
|---|---|---|---|
| JP | 60123518 A | 7/1985 | |
| JP | 4353407 A | 12/1992 | |
| JP | 11503183 A | 3/1999 | |
| JP | 2006182011 A | 7/2006 | |
| JP | 2006198883 A | 8/2006 | |
| JP | 2009019174 A | 1/2009 | |
| JP | 2010000612 A | 1/2010 | |
| WO | 9631547 A1 | 10/1996 | |
| WO | WO 2008015842 A1 * | 2/2008 | B29C 43/46 |
| WO | 2008096594 A1 | 8/2008 | |
| WO | 2008/124180 A1 | 10/2008 | |

OTHER PUBLICATIONS

Choi, P., et al., "Siloxane Copolymers for Nanoimprint Lithography", Advanced Functional Materials, Wiley-VCH Verlag GmbH & Co. KGAA, DE, vol. 17, No. 1, Jan. 5, 2007, pp. 65-70.

Uchida, Tomohisa, et al., "Dispersion (co)polymerization of styrene in polymeric media to prepare polymer micro blends", Designed Monomers & Polymers, vol. 5, No. 2, Jun. 1, 2002, pp. 285-296.

Shinoda, Hosei, et al., "Structural Control of Poly(methyl methacrylate)-g-poly(dimethylsiloxane) Copolymers Using Controlled Radical Polymerization: Effect of the Molecular Structure on Morphology and Mechanical Properties", Macromolecules, vol. 36, No. 13, Jul. 1, 2003, pp. 4772-4778.

Shinoda, Hosei, et al., "Improving the Structural Control of Graft Copolymers, Copolymerization of Poly (dimethylsiloxane) Macromonomer with Methyl Methacrylate Using RAFT Polymerization", Macromolecular Rapid Communications, vol. 22, No. 14, Oct. 1, 2001, p. 1176.

\* cited by examiner (a)

(b)

RESIN MOLD FOR NANOIMPRINTING

TECHNICAL FIELD

The present invention relates to a resin mold for nanoimprinting, which has good release properties. More particularly, the present invention relates to a resin mold which has good release properties, can be easily produced and is suitable particularly for nanoimprinting.

BACKGROUND ART

Nanoimprinting technique is a technique comprising pressing a mold having a pattern of depressions and protrusions formed thereon against a liquid resin or the like on a substrate to transfer the pattern of the mold onto the resin. As such patterns of depressions and protrusions, those from nanoscale of 10 nm-level to about 100 μm are present, and they have been used in various fields, such as fields of semiconductor materials, optical materials, memory media, micro machines, biotechnology and environment.

The type of nanoimprinting is, for example, thermal nanoimprinting comprising bringing a mold, on a surface of which a given shape has been provided, into pressure contact with a thermoplastic resin melted at a temperature of not lower than the glass transition temperature to thermally nanoimprint the surface shape of the mold onto the thermoplastic resin, cooling the mold and then removing the mold, or photo nanoimprinting comprising pressing a mold similar to the above mold against a photo-curable resin, curing the photo-curable resin by irradiation with energy rays such as ultraviolet rays and then removing the mold.

On the other hand, taking strength, hardness, processability, dimensional stability, etc. into consideration, quartz, silicon or the like is usually used for the mold. These materials, however, have problems that they are liable to be broken, are expensive and need a long time for producing a mold, and in order to solve these problems, a replica mold is produced using the mold of quartz or the like as a master mold to thereby cope with the mass production.

As the replica mold, a mold made of a resin is known from the viewpoints of general-purpose properties and cost. This is a resin mold for nanoimprinting.

Such a resin mold for nanoimprinting is formed by bringing a master mold into contact with a laminate consisting of a substrate and a resin layer to transfer a depression-protrusion shape having been formed on the master mold to the resin layer of the laminate. The nanoimprinting is a method in which a laminate consisting of a substrate and a resin such as PMMA laminated on the substrate is brought into contact with the thus formed resin mold for nanoimprinting under heating at a temperature of not lower than the glass transition temperature (Tg) to transfer the depressions and protrusions having been formed on the resin mold for nanoimprinting onto the resin 5. After the transfer is carried out as above, the resin is cooled, and then the resin is released from the resin mold for nanoimprinting, whereby the depression-protrusion shape having been formed on the mold can be transferred to the resin 5. This is an example of thermal transfer, and in addition to such thermal transfer, photo-curing transfer using a photo-curable resin as the resin has been carried out to transfer the depression-protrusion shape.

By bringing the resin mold for nanoimprinting formed as above into contact with a thermoplastic resin or a photo-curable resin or a film on which such a resin has been laminated and transferring the depression-protrusion shape having been formed on the resin mold surface to the surface of the thermoplastic resin or the photo-curable resin, various devices can be produced.

However, the replica mold used as above and the thermoplastic resin or the photo-curable resin to which the depression-protrusion shape is to be transferred are both resins, and therefore, when the resin is released, the depression-protrusion shape having been formed on the replica mold is sometimes broken off, or also the depression-protrusion shape transferred to the thermoplastic resin or the photo-curable resin is sometimes broken off.

On this account, a film of an oxide such as silicon oxide is formed on the surface of a conventional replica mold (resin mold for nanoimprinting), and on this oxide film surface a release agent layer is further formed to not only enhance durability of the replica mold but also improve release properties.

However, in order to form an oxide layer on the surface of the resin layer as above, vacuum deposition technique of high level becomes necessary. Moreover, when a release agent layer is further formed on the surface of the oxide layer, a problem that the release agent layer is transferred from the replica mold also occurs.

In order to solve such problems, an invention of "a photo-curable resin composition characterized in that (a) one or more monomers having 3 or more acrylic groups and/or methacrylic groups in one molecule are contained in an amount of 20 to 60% by weight, (b) the amount of a component which is bonded by photo-curing reaction and becomes a solid is not less than 98% by weight, and (c) the viscosity at 25° C. is not more than 10 mPa·s" is disclosed in claim 1 of a patent literature 1 (Japanese Patent Laid-Open Publication No. 2009-19174), and in claim 3, it is described that this photo-curable resin composition contains 0.1 to 10% by weight of a silicone compound containing an acrylic group and/or a methacrylic group. Further, it is described in paragraph [0001] that the invention described in the cited literature 1 is an invention of a molded product produced by the use of this resin composition.

However, described in the cited literature 1 is an invention of improvement in mold release properties of the resin of the photo-curable composition by copolymerizing a silicone compound having an acrylic group or a methacrylic group. The silicon compound described in this cited literature 1 is a compound having reactive unsaturated groups such as acrylic groups or methacrylic groups at both ends, similarly to silicon diacrylate (see, for example, paragraph [0034] and paragraph [0035]). When a silicone compound having reactive unsaturated groups at both ends is used as above, the reactive unsaturated groups at both ends react with another monomer so as to form, for example, a crosslinked structure. Therefore, such a silicone compound is not present as a graft chain on the surface of the resin, and copolymerization of the silicon compound having reactive unsaturated groups at both ends rarely has influence on the mold release properties.

In claim 1 of a patent literature 2 (Japanese Patent Laid-Open Publication No. 2010-00612), an invention of "a curable composition for nanoimprinting, containing a monofunctional polymerizable compound in an amount of not less than 87% by mass and a poltopolymerization initiator" is described. In paragraph [0029], it is described that this curable composition for nanoimprinting preferably contains a silicone resin. However, described in this cited literature 2 is that mold release properties are imparted by adding the silicone resin, and such a silicone resin does not have reactivity with the resin that is a mainagent. By adding such a silicone resin alone, mold release properties are improved, but the silicone resin does not react with the resin that is a main agent, so that there is a problem that falling-off of the silicone resin is liable to occur.

In claim 1 of a patent literature 3 (Japanese Patent Laid-Open Publication No. 2006-198883), an invention of "a mold having a fine pattern on its surface and containing not less than 0.1% by mass of a fluorine-containing polymer containing recurring units based on at least one fluoromonomer selected from the group consisting of vinyl fluoride, vinylidene fluoride, trifluoroethylene, chlorotrifluoroethylene, tetrafluoroethylene, pentafluoropropylene, hexafluoropropylene, fluoroacrylate and fluoromethacrylate" is disclosed.

In a patent literature 4 (Japanese Patent Laid-Open Publication No. 2006-182011), an invention of "a mold for photocurable resin molding, having a fine pattern on its surface and having a total light transmittance of not less than 90% at wavelengths of 200 to 500 nm, wherein the mold contains not less than 50% by mass of a fluorine-containing polymer" is disclosed.

In the patent literatures 3 and 4, release properties are imparted to the resin mold by the use of a fluorine copolymer, and use of fluoroacrylate is also described. However, the fluoroacrylate used herein has a low molecular weight, and there is a problem that such graft chains as effectively act on the release properties are not formed.

CITATION LIST

Patent Literature

Patent literature 1: Japanese Patent Laid-Open Publication No. 2009-19174
Patent literature 2: Japanese Patent Laid-Open Publication No. 2010-00612
Patent literature 3: Japanese Patent Laid-Open Publication No. 2006-198883
Patent literature 4: Japanese Patent Laid-Open Publication No. 2006-182011

It is an object of the present invention to provide a resin mold for nanoimprinting, which is free from transfer defects, has excellent releasability from a resin on which imprinting has been performed and has no defects due to imprinting. It is another object of the present invention to provide a resin mold for nanoimprinting, which itself has release properties even if a release agent layer is not formed.

SUMMARY OF THE INVENTION

The resin mold for nanoimprinting of the present invention is a resin mold for nanoimprinting, comprising a substrate and a resin layer having fine depressions and protrusions formed on the surface, wherein the resin layer is formed from 1 to 49 parts by weight of a silicone-based macromonomer and/or a fluorine-based macromonomer and 99 to 51 parts by weight of at least one polymerizable monomer selected from the group consisting of a (meth)acrylic monomer, a styrene-based monomer, an epoxy-based monomer, an olefin-based monomer and a polycarbonate-based resin-forming monomer, the silicone-based macromonomer and/or the fluorine-based macromonomer has a molecular weight of 600 to 10000 and has, at an end of molecule, a reactive group copolymerizable with the polymerizable monomer, and when the reactive group is copolymerized with the polymerizable group, silicone-based units or fluorine-based units that constitute the macromonomer form side chains on a trunk polymer formed from the polymerizable monomer and the macromonomer.

In this resin mold for nanoimprinting, the resin layer may be formed on one substrate selected from the group consisting of a resin substrate, a glass substrate, a silicon substrate, a sapphire substrate, a carbon substrate and a GaN substrate.

When the thickness of the resin layer is designated by y and the height of the protrusion formed on the resin layer is designated by x in the resin mold for nanoimprinting of the present invention, the resin layer preferably has a relationship represented by the following formula (I):

$$y = n \times x \quad (I)$$

wherein n is a value ranging from 1 to 15.

The resin mold for nanoimprinting of the present invention is formed by copolymerizing a macromonomer having a reactive polymerizable group at an end with another monomer. This macromonomer preferably has the reactive polymerizable group at one end, and the silicone units or the fluorine-containing units that constitute the macromonomer preferably form a chain structure.

The resin that constitutes the resin mold for nanoimprinting of the present invention has a weight-average molecular weight (Mw), as measured by gel permeation chromatography, of 50000 to 150000.

In the present invention, the pitch of repeating units of the surface shape formed on the resin layer is in the range of 10 to 50000 nm On the surface of the resin layer that constitutes the resin mold for nanoimprinting of the present invention, the side chains of the macromonomer are present so that the contact angle between the resin layer surface and pure water may become not less than 100 degrees.

The light transmittance of the resin mold for nanoimprinting of the present invention at 365 nm is usually not less than 75%.

The resin mold for nanoimprinting of the present invention can be also arranged on a surface of a roller.

In the resin mold for nanoimprinting of the present invention, a specific macromonomer is used, so that parts having a release function are bonded in the form of branches to the main chain of the resin and are present in the vicinity of the surface. Therefore, bleedout of a release agent does not occur differently from a conventional resin mold, and falling-off of the parts having a release function can be inhibited.

Moreover, by copolymerizing a silicone-based or fluorine-based macromonomer having a number-average molecular weight (Mn) of 600 to 10000, a structure (side chain part) having a release function can be allowed to be present on the surface of the resin mold composed of such a copolymer, and good release properties are exhibited.

DETAILED DESCRIPTION OF THE INVENTION

Next, the resin mold for nanoimprinting of the present invention is described making reference to the drawings.

Figure 1:
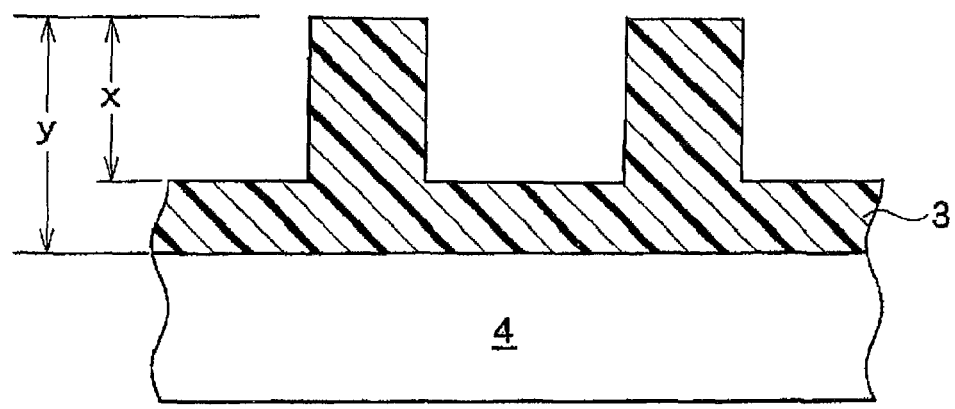
FIG. 1 is a sectional view showing an example of the resin mold for nanoimprinting of the present invention.

FIG. 1 schematically shows an example of a section of the resin mold of the present invention.

The mold of the present invention has a resin layer 3, on a surface of which fine depressions and protrusions of nano-order have been usually formed. This resin layer 3 is generally formed on one surface of a substrate 4.

Examples of the substrates include a resin substrate, a glass substrate, a silicon substrate, a sapphire substrate, a GaN substrate, a carbon substrate and a silicon nitride substrate. Particularly in the present invention, any one substrate of a resin substrate, a glass substrate, a silicon substrate, a sapphire substrate and a GaN substrate is preferably used.

Examples of resins used for the substrate include polyethylene terephthalate, polycarbonate, polymethylmethacrylate, polystyrene, cyclic polyolefin, polyimide, polysulfone, polyether sulfone and polyethylene naphthalate.

In the present invention, the substrate may be in the form of a film or a plate. That is to say, the thickness of the substrate is usually about 0.01 to 1 mm, preferably about 0.05 to 0.5 mm.

In the present invention, the resin layer 3 is usually formed on a surface of such a substrate 4 as above.

In the present invention, the resin layer 3 is a layer of a copolymer of a macromonomer and a polymerizable monomer.

The macromonomer for use in the present invention is a silicone-based macromonomer and/or a fluorine-based macromonomer.

The silicone-based macromonomer employable in the present invention is a macromonomer having a molecular weight of 600 to 10,000, preferably 1,000 to 10,000. Also when a fluorine-based macromonomer is used in the present invention, the fluorine-based macromonomer is a macromonomer having a molecular weight of 600 to 10,000, preferably 1,000 to 10,000. Because the macromonomer has such a molecular weight, a resin mold having good transfer ability can be formed.

In the present invention, the macromonomer has a reactive group copolymerizable with a polymerizable monomer at one end of molecule. By the use of a macromonomer having a reactive group at one end, a silicone-containing group or a fluorine-containing group can be introduced into the resin for forming the resin mold, as a graft group on the main chain. By the use of a macromonomer having reactive groups at both ends, a silicone-containing component unit or a fluorine-containing component unit is introduced into the main chain (trunk polymer) of the resin for forming the resin mold, and a silicon-containing group or a fluorine-containing group is introduced as a graft group that is graft-bonded to the main chain of the resin. Accordingly, the resulting depression-protrusion structure for nanoimprinting becomes a strong structure because of the main chain, and in the vicinity of the surface of the depression-protrusion structure thus formed, silicone-containing groups or fluorine-containing groups come to be present, whereby excellent release properties can be imparted to the surface of the resin mold for nanoimprinting of the present invention. That is to say, such silicone-containing groups or fluorine-containing groups are introduced as graft chains on the main chain. As a result, when a molded product is produced, these graft chains are present on the surface of the molded product in a higher concentration than in the central part of the molded product, and they tend to extend along the surface of the molded product to spread over the surface of the molded product. Hence, the resin mold thus formed comes to have good release properties. On the other hand, because these graft chains are bonded to the main chain and united with the main chain, falling-off of the graft chains does not occur.

The silicone-based macromonomer for use in the present invention can be prepared by using a publicly known process.

According to the preparation process utilizing anionic polymerization described in, for example, Japanese Patent Laid-Open Publication No. 1984-78236, cyclic trisiloxane, cyclic tetrasiloxane or the like is polymerized using a polymerization initiator such as lithium trialkyl silanolate to obtain a silicone living polymer, and this polymer is allowed to react with γ-methacryloyloxypropyl-monochlorodimethylsilane or the like. In Japanese Patent Laid-Open Publication No. 1983-167606 and Japanese Patent Laid-Open Publication No. 1985-123518, a preparation process utilizing condensation reaction, that is, a process using condensation reaction of silicone having a silanol group at an end with γ-methacryloyloxypropyltrimethoxysilane or the like is described. A process for preparing the fluorine-based macromonomer is described in, for example, National Publication of International Patent No. 1999-503183. That is to say, in a flask, 24.18 g of commercially available hydroxypropyl-terminated polydimethylsiloxane having a molecular weight of 947 and 10.76 g of distilled trimethyl hexamethylene diisocyanate are placed. The mixture is vigorously shaken for several minutes, and then 0.04 g of dibutyltin dilaurate is added. Next, the mixture is further shaken for 5 minutes and then stirred for one night. During first one hour, mild exotherm is observed. Next, to this reaction mixture, 103.30 g of commercially available PFPE having a molecular weight of about 2,000 (hydroxyl value: 55.40) and 0.10 g of dibutyltin dilaurate are added. They are vigorously shaken for several minutes again, and then the mixture is stirred for one night. An infrared spectrum is measured to confirm disappearance of an isocyanate peak. Next, to this mixture, 7.92 g of isocyanatoethyl methacrylate having been just distilled is added. The flask is vigorously shaken, and the mixture is stirred for one night. An infrared spectrum is measured again to confirm disappearance of an isocyanate peak. The resulting compound is a fluorine-based macromonomer having an acrylate group at one end and represented by the following formula (IV).

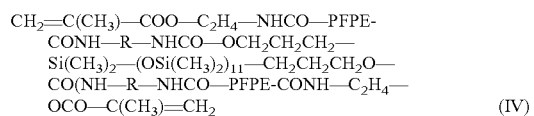

$$CH_2=C(CH_3)-COO-C_2H_4-NHCO-PFPE-CONH-R-NHCO-OCH_2CH_2CH_2-Si(CH_3)_2-(OSi(CH_3)_2)_{11}-CH_2CH_2CH_2O-CO(NH-R-NHCO-PFPE-CONH-C_2H_4-OCO-C(CH_3)=CH_2 \quad (IV)$$

In the present invention, the resin for forming the resin mold can be prepared by, for example, copolymerizing such a macromonomer as above and a specific polymerizable monomer. The specific polymerizable monomer used herein is a monomer that is copolymerizable with the macromonomer, and the resulting copolymer is desired to be a resin to which a depression-protrusion shape having been formed on a master mold can be easily transferred and which has high transparency. As such a polymerizable monomer, at least one polymerizable monomer selected from the group consisting of a (meth)acrylic monomer, a styrene-based monomer, an epoxy-based monomer, an olefin-based monomer and a polycarbonate-based monomer is used. These polymerizable monomers have high reactivity with the macromonomer, and the resulting copolymer has high transparency. Moreover, because the resulting copolymer is soluble in an organic solvent, it is possible to form a resin layer having uniformity and high transparency.

Examples of the (meth)acrylic monomers for use in the present invention include alkyl(meth)acrylates, such as methyl(meth)acrylate, ethyl(meth)acrylate, n-propyl(meth)acrylate, n-butyl(meth)acrylate, isobutyl(meth)acrylate, t-butyl (meth)acrylate, 2-ethylhexyl(meth)acrylate, lauryl(meth) acrylate, stearyl(meth)acrylate and isobornyl(meth)acrylate, hydroxyalkyl(meth)acrylates, such as hydroxyethyl(meth) acrylate, hydroxypropyl(meth)acrylate and hydroxybutyl (meth)acrylate, ethylene oxide-modified hydroxy(meth) acrylate, lactone-modified hydroxy(meth)acrylate, acrylic acid, and methacrylic acid.

Examples of the styrene-based monomers include styrene and α-alkylstyrene.

Examples of the olefin-based monomers include straight-chain olefins of 2 to 20 carbon atoms, such as ethylene, propylene and hexane, and cycloolefins.

Examples of the epoxy-based monomers include glycidyl methacrylate and 4-hydroxybutyl acrylate glycidyl ether.

Examples of the polycarbonate-based resin-forming monomers include a combination of bisphenol and diphenyl carbonate or phosgene.

In the present invention, the macromonomer and the polymerizable monomer are used in such amounts that the weight ratio between them is in the range of 1 to 49:99 to 51 (part (s) by weight). If the amount of the macromonomer copolymerized deviates from the above range and is too small, the resin mold does not exhibit sufficient release action, or the shape of the resin mold is broken. On the other hand, if the amount of the macromonomer polymerized deviates from the above range and is too large, the resulting resin becomes opaque, and a transparent resin layer cannot be obtained.

Although the weight-average molecular weight of the resin, which is obtained as above and is used for forming a resin layer, has only to be such a weight-average molecular weight as to be able to form a resin layer of high transparency, it is usually 5 to 150,000, preferably 6 to 100,000.

In such a resin, silicone-based units derived from the silicone-based macromonomer or fluorine-based units derived from the fluorine-based macromonomer form linear side chains on the trunk polymer. It is preferable that the silicone units or the fluorine-containing units that constitute the macromonomer form a chain structure.

Such a resin is dissolved in an organic solvent such as toluene or xylene, so that a thin film of a uniform thickness is formed. For forming the thin film, usual thin film-forming technique such as spin coating or blade coating can be used.

The thickness of the resin layer thus formed is usually 50 nm to 30 μm, preferably 500 nm to 10 μm. When the thickness of the resin layer is in the above range, the resin layer has such strength as to withstand stamping, has high smoothness and is easy to handle. In the case where depressions and protrusions are formed on the resin layer, the thickness of the resin layer means a distance y between the bottom surface of the resin layer and the highest surface of the surfaces of the depressions and protrusions, as shown in FIG. 1.

After the resin layer is formed as above, the solvent contained in the resin layer is removed by heating using a hot plate or the like.

Subsequently, a master mold is brought into contact with the surface of the resin layer, then the resin layer is heated to a temperature of not lower than the glass transition temperature (Tg) of the resin layer-forming resin, then thereto is applied usually a pressure of 2 to 50 MPa, preferably 5 to 30 MPa, and the pressure is held usually for 1 to 10 minutes, whereby the fine depressions and protrusions having been formed on the surface of the master mold are transferred to the resin layer. After cooling, the resin layer is released from the master mold, whereby the resin mold for nanoimprinting of the present invention can be formed.

When the thickness of the resin layer is designated by y and the height of the protrusion formed on the resin layer is designated by x in the resin mold for nanoimprinting of the present invention thus formed, the resin mold preferably satisfies a relationship represented by the following formula (I).

$$y = n \times x \quad (I)$$

In the formula (I), n is a value ranging from 1 to 15, preferably a value ranging from 1 to 10.

On the surface of the resin mold for nanoimprinting of the present invention, silicone-based units or fluorine-based units derived from the macromonomer are locally present, and therefore, the resin mold has good releasability from the master mold and has an advantage that it does no damage to the master mold when released.

The pitch of repeating units of the surface shape that is transferred to the resin layer from the master mold as above is usually in the range of 10 to 50000 nm. According to the present invention, the shape of the surface of the master mold having such surface shape repeating units as above can be efficiently transferred.

The resin mold for nanoimprinting of the present invention is suitable for forming a pattern having, for example, line/space of 50 to 500 nm, frequency of 100 to 10000 nm and a transfer area of 1.0 to $0.25 \times 10^6$ mm$^2$.

Although there is no specific limitation on the concrete shapes of depressions and protrusions formed on the resin mold for nanoimprinting of the present invention, there can be mentioned various shapes, such as line, column, monolith, cone and micro-lens.

On the surface of the resin mold for nanoimprinting of the present invention formed as above, the side chains of the macromonomer are present so that the contact angle between the resin mold surface and pure water may become not less than 100 degrees, preferably not less than 105 degrees. That is to say, it is thought that when the resin layer is brought into contact with a master mold to transfer the depressions and protrusions having been formed on the master mold, the silicone units or the fluorine-containing units derived from the side chains of the macromonomer are pressed against the surface of the resin mold by application of pressure. On this account, by virtue of the contact with the master mold, the proportion of the silicone units or the fluorine-containing units tends to be increased on the surface of the resin mold of the present invention, and the resin mold for nanoimprinting of the present invention comes to have good release properties.

Figure 2:
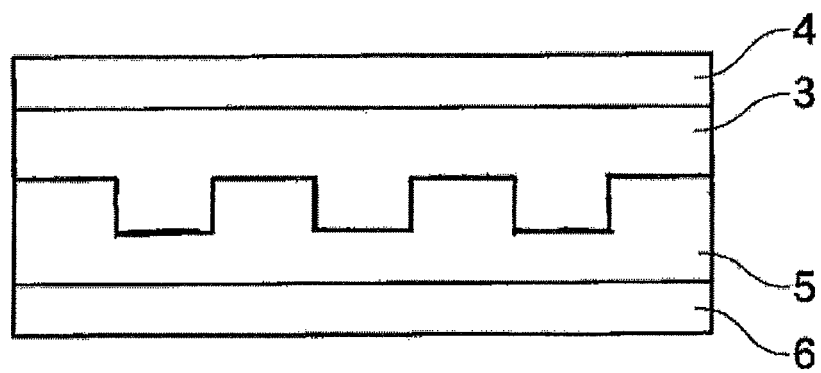
FIG. 2 is a group of sectional views showing an example of a method using the resin mold for nanoimprinting of the present invention.
Figure 2:
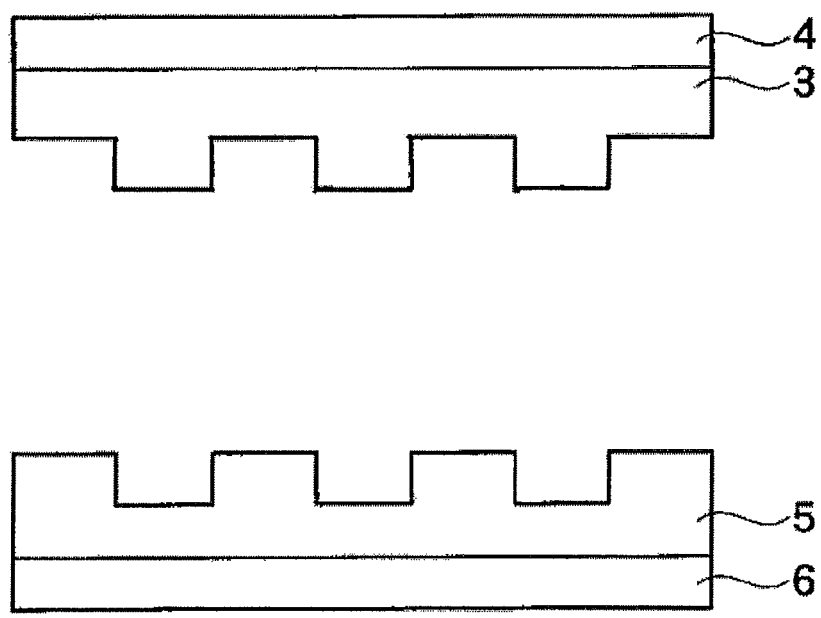

After the resin mold for nanoimprinting of the present invention is produced by bringing a laminate consisting of the substrate 4 and the resin layer 3 into contact with the master mold to transfer the depressions and protrusions, a laminate in which a resin 5 such as PMMA is laminated on a substrate 6 is brought into contact with the resin mold for nanoimprinting produced as above under heating at a temperature of not lower than the glass transition temperature (Tg) to transfer the depressions and protrusions of the resin mold for nanoimprinting to the resin 5, as shown in FIG. 2. After the resin 5 is cooled, the resin 5 is released from the resin mold for nanoimprinting, whereby the depression-protrusion shape having been formed on the mold can be transferred onto the resin 5. This embodiment is an embodiment of thermal transfer, but in the present invention, photo-curing transfer using a photocurable resin as the resin 5 can be also carried out in addition to the thermal transfer.

As an embodiment of use of the resin mold for nanoimprinting of the present invention, use of the resin mold for nanoimprinting as a roller type resin mold for imprinting can be mentioned.

Figure 3:
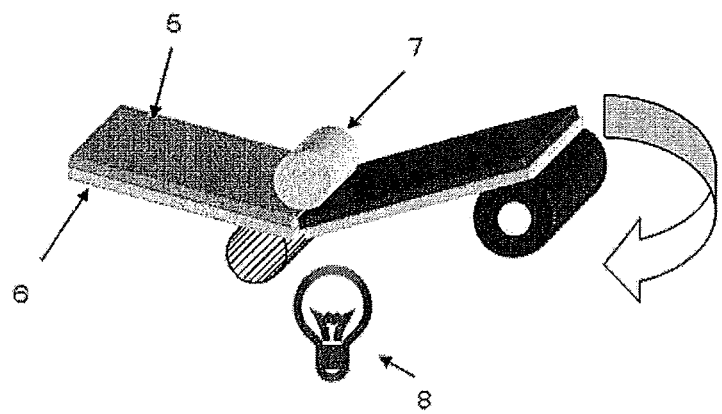
FIG. 3 is a conceptual view showing a working example in which nanoimprinting is continuously carried out by arranging the resin mold for nanoimprinting of the present invention on a roll.

When the resin mold for nanoimprinting of the present invention is used as the roller type resin mold for imprinting, the resin mold for imprinting is wound round a roller or the like in such a manner that the depression-protrusion surface faces outside, to form a transfer roll, as shown in FIG. 3.

As the roller type resin mold for imprinting, a two-layer mold having a thickness of 30 to 300 μm and having a flexible constitution is preferable.

Between the roll on which the resin mold for nanoimprinting has been arranged and another usual roll, a resin sheet or resin film made of a photo-curable resin is passed, and light irradiation is carried out with applying pressure, whereby depressions and protrusions of the resin mold for imprinting are transferred and fixed onto the surface of the resin sheet or the resin film.

In this method, the resin sheet or the resin film is irradiated with photo-curing rays (energy rays, such as visible rays, ultraviolet rays and X-rays) through the resin mold for nanoimprinting. Therefore, the resin mold for nanoimprinting is desired to have light transmission properties, and its light transmittance at 365 nm is preferably not less than 75%.

By arranging the resin mold for nanoimprinting of the present invention on a roll and using a photo-curable resin as above, nanoimprinting can be carried out continuously.

On the surface of the resin mold for nanoimprinting of the present invention, silicone-based units or fluorine-based units derived from the macromonomer are present. Therefore, after the depression-protrusion shape is transferred using the resin mold, release of a substance with the transferred shape from the resin mold is easy, and breakage of the transferred depression-protrusion shape does not occur. In the resin mold for nanoimprinting of the present invention, the resin layer is formed by the use of a specific macromonomer, and on its outermost surface, units of the macromonomer having release properties are present. Therefore, the resin mold of the present invention has a constitution entirely different from that of a conventional resin mold in which an oxide layer is formed on a surface of a resin layer and a release agent layer is further formed on a surface of the oxide layer.

Thus, the resin mold of the present invention does not need formation of an oxide layer and formation of a release agent layer on an oxide layer, and hence, the resin mold can be produced very inexpensively and easily.

EXAMPLES

The present invention is described in more detail with reference to the following examples, but it should be construed that the present invention is in no way limited to those examples.

Measurements of various properties in the present invention were carried out by the following methods.

<Weight-Average Molecular Weight Mw>

Weight-average molecular weight was measured by gel permeation chromatography (apparatus: HLC-8220GPC manufactured by Tosoh Corporation, solvent: tetrahydrofuran (THF)) and determined in terms of standard polystyrene.

<Thickness of Resin Layer>

A distance between the bottom surface of the resin layer and the highest surface of the surfaces of depressions and protrusions of the pattern was taken as a thickness of the resin layer.

<Contact Angle of Resin Layer Surface to Pure Water>

An extremely small water droplet of about 1 μl was allowed to stand still on a sample surface, and the contact angle was measured in the atmosphere using KYOWA CONTACT-ANGLE METER CA-D model manufactured by Kyowa Interface Science Co., Ltd. The measuring conditions were in accordance with JIS R3257.

The percentage change was determined by the formula: (contact angle of release agent layer before nanoimprinting−contact angle of release agent layer after nanoimprinting)÷contact angle of release agent layer before nanoimprinting×100(%).

<Surface Shape (Pattern)>

Frequency and line width were evaluated by SEM (S-4800 manufactured by Hitachi High-Technologies Corporation), and depth (height) was evaluated by AFM (L-trace manufactured by SII Nano Technology Inc.).

<Nanoimprinting Results>

Macro evaluation: The transfer surface formed on the resin on which nanoimprinting had been performed was observed by an optical microscope (ELIPSE LV100 manufactured by Nikon Corporation) at 20 magnifications, and whether transfer of resin to the mold had occurred was ascertained.

AA: Transfer of resin did not occur.

BB: Transfer of resin occurred.

SEM (frequency): The frequency of the pattern formed on the resin on which nanoimprinting had been performed was measured by SEM, and a change based on the SEM measurement result of the pattern formed on the surface of the mold for nanoimprinting was judged and evaluated by the following criteria.

AA: The degree of change is less than 10 nm.

BB: The degree of change is not less than 10 nm.

AFM (depth): The depth of the pattern formed on the resin on which nanoimprinting had been performed was measured by AFM, and a change based on the AFM measurement result of the pattern formed on the surface of the mold for nanoimprinting was judged and evaluated by the following criteria.

AA: The degree of change is less than 10 nm.

BB: The degree of change is not less than 10 nm.

Example 1

(1) Preparation of Resin

In a flask equipped with a stirring device, a nitrogen gas introducing pipe, a thermometer and a reflux condenser, 80 parts by weight of methyl methacrylate (trade name: Light Ester M, manufactured by Kyoeisha Chemical Co., Ltd.), 20 parts by weight of a silicone macromer FM-0711 (molecular weight: 1000) (trade name: Silaplane FM-0711, manufactured by Chisso Corporation) and 100 parts by weight of toluene were placed. This silicone macromer FM-0711 is a monofunctional silicone-based macromonomer having a methyl methacrylate group at one end of molecule, and has a constitution in which a large number of silicone-based units from the end methyl methacrylate groups are bonded through siloxane bonds.

Thereafter, the contents in the flask were heated to 80° C. while introducing nitrogen gas into the flask at a rate of 0.3 liter/min. Then, 0.5 part by weight of dimethyl-2,2'-azobis(2-methyl propionate) (trade name: V-601, manufactured by Wako Pure Chemical Industries, Ltd.) was added as an initiator, and the contents were maintained at 80° C. for 8.0 hours.

After the lapse of 8 hours, introduction of nitrogen gas was stopped, and 100 parts by weight of toluene were added to lower the temperature of the contents, whereby the reaction was completed to obtain a resin for a resin mold.

The resulting resin had a weight-average molecular weight (Mw), as measured by gel permeation chromatography, of 83,000.

(2) Formation of Resin Layer

The resin prepared in the step (1) was diluted to 10 times with toluene, applied onto a PET film (trade name: Lumiler™, manufactured by Toray Industries, Inc., thickness: 0.125 mm) that became a substrate by spin coating and dried by the use of a hot plate at 130° C. for 15 minutes to form a resin layer having a thickness of 1.2 μm.

A visible light (wavelength: 365 nm) transmittance of the resin-coated PET film was measured (measuring equipment: ultraviolet visible spectrophotometer V-670, manufactured by JASCO Corporation).

(3) Formation of Pattern on Resin Layer Surface

The laminate of the film substrate and the resin layer was heated to 140° C. using ST-50 manufactured by Toshiba Machine Co., Ltd., then a master mold (quartz mold having been subjected to release treatment, transfer surface: 576 mm$^2$, 150 L/S (line and space), frequency: 300 nm, depth: 150 nm) was brought into contact with the resin layer surface, and thermal nanoimprinting was carried out at 140° C. In this thermal nanoimprinting, the pressure of a pressing machine was set at 20 MPa, and the holding time was set to 5 minutes.

Subsequently, the laminate was cooled to 80° C., and the master mold was removed to obtain a resin mold for nanoimprinting, having a resin layer on one side surface of which a pattern (transfer surface: 576 mm$^2$, 150 L/S, frequency: 300 nm, depth: 150 nm) had been formed.

The surface shape of the resulting resin mold for nanoimprinting was observed by the use of SEM (S-4800, manufactured by Hitachi High-Technologies Corporation), and it was confirmed that the surface shape had no defect or no deformation.

Further, the contact angle of the surface of the resulting resin mold for nanoimprinting to pure water was measured by the use of KYOWA CONTACT-ANGLE METER CA-D model manufactured by Kyowa Interface science Co., Ltd., and as a result, the contact angle was 110 degrees. Measurement of the contact angle to pure water was carried out as follows: an extremely small water droplet of about 1 microliter was allowed to stand still on a sample surface, and the contact angle was measured in the atmosphere.

(4) Nanoimprinting Using Resin Mold for Nanoimprinting

On the resin mold for nanoimprinint formed as above, 0.2 ml of a photo-curable resin (trade name: PAK-02, manufactured by Toyo Gosei Co., Ltd.) was dropped, then a polycarbonate film (trade name: Lexan, manufactured by Asahi Glass Co., Ltd., thickness: 0.18 mm) was allowed to stand still thereon, and while pressing down the polycarbonate film at a pressure of 1.0 MPa, irradiation with ultraviolet light of 10 mW/cm$^2$ was carried out for 2 seconds using a photo nanoimprinting apparatus (manufactured by Engineering System Co., Ltd.).

Such an operation as above was taken as one shot, and the operation was repeated 20 shots.

Thereafter, the resin mold for nanoimprinting was removed.

Presence or absence of defects such as falling-off of the resin layer from the thus removed resin mold for nanoimprinting after the nanoimprinting was observed visually and by the use of an optical microscope (macro evaluation, trade name: ELIPSE LV100, manufactured by Nikon Corporation), and further, the contact angle was also measured.

Moreover, the surface shape of the resin on which nanoimprinting had been performed was observed by means of SEM and AFM, and as a result, a pattern having a line width of 148 nm, frequency of 298 nm and a depth of 148 nm was confirmed.

The results are set forth as nanoimprinting results in Table 1.

Example 2

A resin mold for nanoimprinting was prepared in the same manner as in Example 1, except that 99 parts by weight of methyl methacrylate and 1 part by weight of a silicone macromer FM-0711 (molecular weight: 1000) were used instead of 80 parts by weight of methyl methacrylate and 20 parts by weight of a silicone macromer FM-0711 (molecular weight: 1000) in the step (1) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 1.

Example 3

A resin mold for nanoimprinting was prepared in the same manner as in Example 1, except that 51 parts by weight of methyl methacrylate and 49 parts by weight of a silicone macromer FM-0711 (molecular weight: 1000) were used instead of 80 parts by weight of methyl methacrylate and 20 parts by weight of a silicone macromer FM-0711 (molecular weight: 1000) in the step (1) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 1.

Comparative Example 1

A resin mold for nanoimprinting was prepared in the same manner as in Example 1, except that 99.1 parts by weight of methyl methacrylate and 0.9 part by weight of a silicone macromer FM-0711 (molecular weight: 1000) were used instead of 80 parts by weight of methyl methacrylate and 20 parts by weight of a silicone macromer FM-0711 (molecular weight: 1000) in the step (1) of Example 1.

The resulting resin mold for nanoimprinting and the nanoimprinting results are set forth in Table 1.

Comparative Example 2

A resin mold for nanoimprinting was intended to be prepared in the same manner as in Example 1, except that 50 parts by weight of methyl methacrylate and 50 parts by weight of a silicone macromer FM-0711 (molecular weight: 1000) were used instead of 80 parts by weight of methyl methacrylate and 20 parts by weight of a silicone macromer FM-0711 (molecular weight: 1000) in the step (1) of Example 1. However, the resin became opaque and the light transmittance was lowered, so that a resin mold for photo nanoimprinting could not be prepared.

The results are set forth in Table 1.

TABLE 1

Difference in amount (part(s) by weight) of Silicone macromer FM-0711 in copolymerization

|  |  | Ex. 1 | Ex. 2 | Ex. 3 | Comp. Ex. 1 | Comp. Ex. 2 |
|---|---|---|---|---|---|---|
| Master mold |  |  | I |  | I |  |
| Substrate | Type |  | PET |  | PET |  |
|  | Thickness (mm) |  | 0.125 |  | 0.125 |  |
| Resin Composition | Methyl methacrylate | 80 | 99 | 51 | 99.1 | 50 |
|  | Silicone macromer FM-0711 | 20 | 1 | 49 | 0.9 | 50 |
|  | Thickness (μm) | 1.2 | 1.2 | 1.2 | 1.3 | 1.2 |
|  | Weight-average molecular weight (Mw) | 83,000 | 85,000 | 84,000 | 83,000 | 83,000 |
| 365 nm Light transmittance (%) |  | 82 | 81 | 82 | 84 | 32 |
| Contact angle to water (°) | Before imprinting | 110 | 102 | 114 | 75 | — |
|  | After 20-shot imprinting | 108 | 102 | 114 | 54 | — |
|  | Percentage change after 20-shot imprinting (%) | 1.8 | 0.0 | 0.0 | 28.0 | — |
| Nanoimprinting results | Macro examination | AA | AA | AA | BB | — |
|  | SEM (frequency) | AA | AA | AA | BB | — |
|  | AFM (height) | AA | AA | AA | BB | — |

Pattern frequency: 300 nm, shape: L/S, depth (height): 150 nm

In table 1, "-" of Comparative Example 2 indicates that because of opacity, preparation of a resin mold itself was not carried out.

Example 4

A resin mold for nanoimprinting was prepared in the same manner as in Example 1, except that 20 parts by weight of a silicone macromer FM-0721 (molecular weight: 5000, trade name: Silaplane FM-0721, manufactured by Chisso Corporation) were used instead of 20 parts by weight of a silicone macromer FM-0711 (molecular weight: 1000) in the step (1) of Example 1. This silicone macromer FM-0721 is a monofunctional silicone-based macromonomer having a methyl methacrylate group at one end of molecule, and has a constitution in which a large number of silicone-based units from the end methyl methacrylate groups are bonded by siloxane bonds.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 2.

Example 5

A resin mold for nanoimprinting was prepared in the same manner as in Example 1, except that 20 parts by weight of a silicone macromer FM-0725 (molecular weight: 10000, trade name: Silaplane FM-0725, manufactured by Chisso Corporation) were used instead of 20 parts by weight of a silicone macromer FM-0711 (molecular weight: 1000) in the step (1) of Example 1. This silicone macromer FM-0725 is a monofunctional silicone-based macromonomer having a methyl methacrylate group at one end of molecule, and has a constitution in which a large number of silicone-based units from the end methyl methacrylate groups are bonded by siloxane bonds.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 2.

Example 6

A resin mold for nanoimprinting was prepared in the same manner as in Example 1, except that 20 parts by weight of a silicone macromer FM-7711 (molecular weight: 1,000, trade name: Silaplane FM-7711, manufactured by Chisso Corporation) were used instead of 20 parts by weight of a silicone macromer FM-0711 (molecular weight: 1000) in the step (1) of Example 1. This silicone macromer FM-7711 is a bifunctional silicone-based macromonomer having methyl methacrylate groups at both ends of molecule, and has a constitution in which a large number of silicone-based units from the end methyl methacrylate groups are bonded by siloxane bonds.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 2.

Example 7

A resin mold for nanoimprinting was prepared in the same manner as in Example 1, except that 20 parts by weight of a fluorine-based macromer (prepared by the process described in Example 1 of National Publication of International Patent No. 1999-503183, molecular weight: 8000) were used instead of 20 parts by weight of a silicone macromer FM-0711 (molecular weight: 1000) in the step (1) of Example 1.

That is to say, in a round flask of 250 ml, 24.18 g of commercially available hydroxypropyl-terminated polydimethylsiloxane having a molecular weight of 947 and 10.76 g of distilled trimethyl hexamethylene diisocyanate were placed. The mixture was vigorously shaken for several minutes, and then 0.04 g of dibutyltin dilaurate was added. Next, the mixture was further shaken for 5 minutes and then stirred for one night. During first one hour, mild exotherm was observed. Next, to this reaction mixture, 103.30 g of commercially available PFPE having a molecular weight of about 2,000 (hydroxyl value: 55.40) and 0.10 g of dibutyltin dilaurate were added. The mixture was vigorously shaken for several minutes again, and then the mixture was stirred for one night. An infrared spectrum was measured, and disappearance of an isocyanate peak was confirmed. Next, to this mixture, 7.92 g of isocyanatoethyl methacrylate having been just distilled was added. The flask was vigorously shaken, and then the mixture was stirred for one night. An infrared spectrum was measured again, and disappearance of an inocyanate peak was confirmed. The resulting viscous liquid had a structure represented by the following formula (IV).

[Chem. 2]

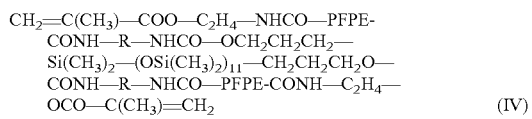

Using the resulting resin mold for nanoimprinting, continuous photo nanoimprinting of 20 shots was carried out in the same manner as in Example 1.

The resulting resin mold for nanoimprinting and the nanoimprinting results are set forth in Table 2.

Comparative Example 3

A resin mold for nanoimprinting was prepared in the same manner as in Example 1, except that 20 parts by weight of reactive silicone FM-0701 (molecular weight: 423, trade name: Silaplane FM-0701, manufactured by Chisso Corporation) were used instead of 20 parts by weight of a silicone macromer FM-0711 (molecular weight: 1000) in the step (1) of Example 1. This reactive silicone FM-0701 is a monofunctional reactive silicone monomer having a methyl methacrylate group at one end of molecule, and has a constitution in which a large number of silicone-based units from the end methyl methacrylate groups are bonded by siloxane bonds. This FM-0701 has a molecular weight of 423 and is not a macromonomer.

The resulting resin mold for nanoimprinting and the nanoimprinting results are set forth in Table 2.

Comparative Example 4

A resin mold for imprinting was prepared in the same manner as in Example 1, except that 20 parts by weight of a silicone macromer X-22-2426 (molecular weight: 12,000, trade name: Modified Silicone Oil X-22-2426, manufactured by Shin-Etsu Silicone Co., Ltd.) were used instead of 20 parts by weight of a silicone macromer FM-0711 (molecular weight: 1000) in the step (1) of Example 1. However, the molecular weight of the silicone macromonomer used herein was too high, and the resin was opaque, so that the resulting resin mold could not be used as a resin mold for photo imprinting. The resulting resin mold for imprinting is set forth in Table 2.

Comparative Example 5

A resin mold for nanoimprinting was prepared in the same manner as in Example 1, except that 20 parts by weight of perfluorooctylethyl methacrylate (molecular weight: 523, trade name: Light Ester FM-108, manufactured by Kyoeisha Chemical Co., Ltd.) were used instead of 20 parts by weight of a silicone macromer FM-0711 (molecular weight: 1000) in the step (1) of Example 1. This perfluorooctylethyl methacrylate has a molecular weight of 532 and is not a macromonomer.

The resulting resin mold for nanoimprinting and the nanoimprinting results are set forth in Table 2.

TABLE 2

Difference in Silicone macromer species

| | | | Ex. 1 | Ex. 4 | Ex. 5 | Ex. 6 | Ex. 7 | Comp. Ex. 3 | Comp. Ex. 4 | Comp. Ex. 5 |
|---|---|---|---|---|---|---|---|---|---|---|
| Master mold | | | | | I | | | | I | |
| Substrate | Type | | | | PET | | | | PET | |
| | Thickness (mm) | | | | 0.125 | | | | 0.125 | |
| Resin | Composition | Methyl methacrylate | 80 | 80 | 80 | 80 | 80 | 80 | 80 | 80 |
| | | Silicone macromer FM-0711 | 20 | | | | | | | |
| | | Silicone macromer EM-0721 | | 20 | | | | | | |
| | | Silicone macromer EM-0725 | | | 20 | | | | | |
| | | Silicone macromer EM-7711 | | | | 20 | | | | |
| | | Fluorine-based macromer | | | | | 20 | | | |
| | | Reactive silicone EM-0701 | | | | | | 20 | | |
| | | Silicone macromer X-22-2426 | | | | | | | 20 | |
| | | Perfluorooctylethyl methacrylate | | | | | | | | 20 |
| | Thickness (μm) | | 1.2 | 1.2 | 1.2 | 1.2 | 1.2 | 1.2 | 1.2 | 1.2 |
| | Weight-average molecular weight (Mw) | | 83,000 | 88,000 | 89,000 | 83,000 | 89,000 | 88,000 | 84,000 | 84,000 |
| 365 nm Light transmittance (%) | | | 82 | 80 | 79 | 82 | 83 | 85 | 22 | 84 |
| Contact angle to water (°) | Before imprinting | | 110 | 112 | 114 | 110 | 112 | 72 | — | 93 |
| | After 20-shot imprinting | | 108 | 112 | 114 | 110 | 112 | 50 | — | 54 |
| | Percentage change after 20-shot imprinting (%) | | 1.8 | 0.0 | 0.0 | 0.0 | 0.0 | 30.6 | — | 41.9 |
| Nanoimprinting results | Macro examination | | AA | AA | AA | AA | AA | BB | — | BB |
| | SEM (frequency) | | AA | AA | AA | AA | AA | BB | — | BB |
| | AFM (height) | | AA | AA | AA | AA | AA | BB | — | BB |

Example 8

A resin mold for nanoimprinting was prepared in the same manner as in Example 1, except that 80 parts by weight of styrene (trade name: Styrene Monomer, manufactured by Idemitsu Kosan Co., Ltd.) were used instead of 80 parts by weight of methyl methacrylate in the step (1) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 3.

Example 9

A resin mold for nanoimprinting was prepared in the same manner as in Example 1, except that 80 parts by weight of isobornyl methacrylate (trade name: Light Ester IB-X, manufactured by Kyoeisha Chemical Co., Ltd.) were used instead of 80 parts by weight of methyl methacrylate in the step (1) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 3.

Example 10

A resin mold for nanoimprinting was prepared in the same manner as in Example 1, except that 80 parts by weight of tert-butyl methacrylate (trade name: Light Ester TB, manufactured by Kyoeisha Chemical Co., Ltd.) were used instead of 80 parts by weight of methyl methacrylate in the step (1) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 3.

Comparative Example 6

A resin mold for nanoimprinting was prepared by carrying out the following operations instead of the step (1) to the step (3) of Example 1.

To 100 parts by weight of polydimethylenesiloxane (PDMS) (trade name: SIM-260, manufactured by Shin-Etsu Silicone Co., Ltd.), 10 parts by weight of a curing agent (trade name: CAT-260, manufactured by Shin-Etsu Silicone Co., Ltd.) were added, and the mixture was well stirred. Thereafter, the mixture was diluted to 10 times with toluene, then applied onto a PET film substrate by spin coating and dried at 130° C. for 15 minutes by the use of a heat press to prepare a resin film having a film thickness of 1.3 μm. This PDMS is a silicone resin cured product and is not a silicone-based macromonomer.

The laminate of the film substrate and the resin layer was heated to 40° C. using ST-50 manufactured by Toshiba Machine Co., Ltd., then a master mold (quartz mold having been subjected to release treatment, transfer surface: 576 mm$^2$, 150 L/S, frequency: 300 nm, depth: 150 nm) was brought into contact with the resin layer surface, and thermal nanoimprinting was carried out at 40° C.

Subsequently, the film substrate provided with the above shape was cured by the use of a hot plate at 40° C. for 12 hours and then at 150° C. for 30 minutes to prepare a resin mold for nanoimprinting (transfer surface: 576 mm$^2$, 150 L/S, frequency: 300 nm, depth: 150 nm).

Using the resulting resin mold for nanoimprinting, nanoimprinting was carried out in the same manner as in the step (4) of Example 1.

The resulting resin mold for nanoimprinting and the nanoimprinting results are set forth in Table 3.

Comparative Example 7

To 100 parts by weight of spin-on glass (SOG) (trade name: LHG-NIL-01 main agent, manufactured by LEAP), 10 parts by weight of a curing agent (trade name: LHG-NIL-01 curing agent, manufactured by LEAP) were added, and the mixture was well stirred. Thereafter, the mixture was applied onto a PET film substrate by spin coating to form a resin film having a film thickness of 1.3 μm.

This spin-on glass is liquid glass capable of being used for spin coating.

The laminate of the film substrate and the resin layer was heated to 40° C. using ST-50 manufactured by Toshiba Machine Co., Ltd., then a master mold (quartz mold having been subjected to release treatment, transfer surface: 576 mm$^2$, 150 L/S, frequency: 300 nm, depth: 150 nm) was brought into contact with the resin layer surface, and thermal nanoimprinting was carried out at 40° C.

Subsequently, the film substrate provided with the above shape was cured by the use of a hot plate at 40° C. for 12 hours and then at 150° C. for 30 minutes to prepare a resin mold for nanoimprinting (transfer surface: 576 mm$^2$, 150 L/S, frequency: 300 nm, depth: 150 nm).

Using the resulting resin mold for nanoimprinting, nanoimprinting was carried out in the same manner as in the step (4) of Example 1.

The resulting resin mold for nanoimprinting and the nanoimprinting results are set forth in Table 3.

TABLE 3

Difference in main monomer species

| | | | Ex. 1 | Ex. 8 | Ex. 9 | Ex. 10 | Comp. Ex. 6 | Comp. Ex. 7 |
|---|---|---|---|---|---|---|---|---|
| Master mold | | | I | | | | I | |
| Substrate | Type | | PET | | | | PET | |
| | Thickness (mm) | | 0.125 | | | | 0.125 | |
| Resin | Composition | Methyl methacrylate | 80 | | | | | |
| | | Styrene | | 80 | | | | |
| | | Isobornyl methacrylate | | | 80 | | | |
| | | Tert-butyl methacrylate | | | | 80 | | |
| | | Silicone macromer FM-0711 | 20 | 20 | 20 | 20 | | |
| | | PDMS | | | | | 100 | |
| | | SOG | | | | | | 100 |
| | Thickness (μm) | | 1.2 | 1.2 | 1.2 | 1.2 | 1.2 | 1.2 |
| | Weight-average molecular weight (Mw) | | 83,000 | 83,000 | 84,000 | 82,000 | immeasurable because of curing | |
| 365 nm Light transmittance (%) | | | 82 | 84 | 83 | 83 | 82 | 82 |
| Contact | Before imprinting | | 110 | 110 | 110 | 110 | 78 | 72 |

TABLE 3-continued

| | | \multicolumn{6}{c}{Difference in main monomer species} | | | | | |
|---|---|---|---|---|---|---|---|
| | | Ex. 1 | Ex. 8 | Ex. 9 | Ex. 10 | Comp. Ex. 6 | Comp. Ex. 7 |
| angle to water (°) | After 20-shot imprinting | 108 | 106 | 108 | 108 | 50 | 48 |
| | Percentage change after 20-shot imprinting (%) | 1.8 | 3.6 | 1.8 | 1.8 | 35.9 | 33.3 |
| Nano-imprinting results | Macro examination | AA | AA | AA | AA | BB | BB |
| | SEM (frequency) | AA | AA | AA | AA | BB | BB |
| | AFM (height) | AA | AA | AA | AA | BB | BB |

Shape of master mold
I pattern frequency: 300 nm, shape: L/S, depth (height): 150 nm

Example 11

A resin mold for nanoimprinting was prepared in the same manner as in Example 1, except that the resin film thickness in the step (2) of Example 1 was changed to 0.4 μm, and the master mold in the step (3) of Example 1 was replaced with a quartz mold (transfer surface: 576 mm², 25 nmL/S, frequency: 50 nm, depth: 50 nm) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

Example 12

A resin mold for nanoimprinting was prepared in the same manner as in Example 1, except that the master mold in the step (3) of Example 1 was replaced with a quartz mold (transfer surface: 576 mm², 75 nm L/S, frequency: 150 nm, depth: 150 nm) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

Example 13

A resin mold for nanoimprinting was prepared in the same manner as in Example 1, except that the master mold in the step (3) of Example 1 was replaced with a quartz mold (transfer surface: 576 mm², 10000 nm L/S, frequency: 20000 nm, depth: 150 nm) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

Example 14

A resin mold for nanoimprinting was prepared in the same manner as in Example 1, except that the master mold in the step (3) of Example 1 was replaced with a quartz mold (transfer surface: 576 mm², hole diameter: 200 nm, frequency: 400 nm, depth: 200 nm, columnar shape) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

Example 15

A resin mold for nanoimprinting was prepared in the same manner as in Example 1, except that the master mold in the step (3) of Example 1 was replaced with a quartz mold (transfer surface: 576 mm², frequency: 300 nm, depth: 300 nm, moth eye shape) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

Example 16

A resin mold for nanoimprinting was prepared in the same manner as in Example 1, except that the resin film thickness in the step (2) of Example 1 was changed to 6.4 μm, and the master mold in the step (3) of Example 1 was replaced with a quartz mold (transfer surface: 576 mm², hole diameter: 1000 nm, frequency: 20000 nm, depth: 800 nm, micro lens shape) having been subjected to release treatment.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 4.

TABLE 4

| | | \multicolumn{7}{c}{Difference in master mold} | | | | | | |
|---|---|---|---|---|---|---|---|---|
| | | Ex. 1 | Ex. 11 | Ex. 12 | Ex. 13 | Ex. 14 | Ex. 15 | Ex. 16 |
| Master mold | Type of mold | I | II | III | IV | V | VI | VII |
| | Frequency (nm) | 300 | 50 | 150 | 20,000 | 400 | 300 | 20,000 |
| | Shape | L/S | L/S | L/S | L/S | column | moth eye | lens |

TABLE 4-continued

|  |  | Difference in master mold | | | | | | |
|---|---|---|---|---|---|---|---|---|
|  |  | Ex. 1 | Ex. 11 | Ex. 12 | Ex. 13 | Ex. 14 | Ex. 15 | Ex. 16 |
| Sub-strate | Type | | | | PET | | | |
|  | Thickness (mm) | | | | 0.125 | | | |
| Resin layer | Type Methyl methacrylate | | | | 80 | | | |
|  | Silicone macromer FM-0711 | | | | 20 | | | |
|  | Thickness (μm) | 1.2 | 0.4 | 1.2 | 1.2 | 1.2 | 1.2 | 6.4 |
|  | Weight-average molecular weight (Mw) | | | | 83,000 | | | |
| 365 nm Light transmittance (%) | | | | | 82 | | | |
| Contact angle to water (°) | Before imprinting | 110 | 110 | 110 | 110 | 110 | 110 | 110 |
|  | After 20-shot imprinting | 108 | 106 | 106 | 106 | 106 | 106 | 106 |
|  | Percentage change after 20-shot imprinting (%) | 1.8 | 3.6 | 3.6 | 3.6 | 3.6 | 3.6 | 3.6 |
| Nano-imprinting results | Macro examination | AA | AA | AA | AA | AA | AA | AA |
|  | SEM (frequency) | AA | AA | AA | AA | AA | AA | AA |
|  | AFM (height) | AA | AA | AA | AA | AA | AA | AA |

Example 17

A resin mold for nanoimprinting was prepared in the same manner as in Example 1, except that the PET film which was a substrate was replaced with soda-lime glass (manufactured by Asahi Glass Co., Ltd., thickness: 1.1 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 18

A resin mold for nanoimprinting was prepared in the same manner as in Example 1, except that the PET film which was a substrate was replaced with a silicon wafer (manufactured by Covalent Material Corporation, grade used: polished wafer, thickness: 0.5 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 19

A resin mold for nanoimprinting was prepared in the same manner as in Example 1, except that the PET film which was a substrate was replaced with a sapphire substrate (manufactured by Orbe Pioneer Ltd., grade used: semiconductor grade, thickness: 0.5 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 20

A resin mold for nanoimprinting was prepared in the same manner as in Example 1, except that the PET film which was a substrate was replaced with a PSF film (trade name: Sumilite™ FS-1200, manufactured by Sumitomo Bakelite Co., Ltd., thickness: 0.12 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 21

A resin mold for nanoimprinting was prepared in the same manner as in Example 1, except that the PET film which was a substrate was replaced with a polycarbonate film (trade name: Lexan, manufactured by Asahi Glass Co., Ltd., thickness: 0.12 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 22

A resin mold for nanoimprinting was prepared in the same manner as in Example 1, except that the PET film which was a substrate was replaced with a polyethylene naphthalate (PEN) film (trade name: Teonex, manufactured by Teijin Chemicals, Ltd., thickness: 0.12 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 23

A resin mold for nanoimprinting was prepared in the same manner as in Example 1, except that the PET film which was a substrate was replaced with a polyimide film (trade name: Aurum Film, manufactured by Mitsui Chemicals, Inc., thickness: 0.3 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 24

A resin mold for nanoimprinting was prepared in the same manner as in Example 1, except that the PET film which was a substrate was replaced with polymethyl methacrylate (trade name: Acryplen, manufactured by Mitsubishi Rayon Co., Ltd., thickness: 0.12 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 25

A resin mold for nanoimprinting was prepared in the same manner as in Example 1, except that the PET film which was a substrate was replaced with a PET film (trade name: Genius Coat DLC, manufactured by Nippon-ITF Inc., thickness: 0.12 mm) having been subjected to coating treatment with diamond-like carbon (DLC) (thickness: 1 μm), in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 26

A resin mold for nanoimprinting was prepared in the same manner as in Example 1, except that the PET film which was a substrate was replaced with glassy carbon (GC) (grade used: SA-1, manufactured by Tokai Carbon Co., Ltd., thickness: 1 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

Example 27

A resin mold for nanoimprinting was prepared in the same manner as in Example 1, except that the PET film which was a substrate was replaced with a silicon carbide (SiC) wafer (grade used: 6HN-Type, manufactured by TanKeBlue Semiconductor Co., Ltd., thickness: 0.43 mm) in the step (2) of Example 1.

Using the resulting resin mold for nanoimprinting, continuous photo nanoimprinting of 20 shots was carried out in the same manner as in Example 1.

The resulting resin mold for nanoimprinting and the nanoimprinting results are set forth in Table 5.

TABLE 5

Difference in type of substrate

|  |  | Ex. 1 | Ex. 17 | Ex. 18 | Ex. 19 | Ex. 20 | Ex. 21 | Ex. 22 |
|---|---|---|---|---|---|---|---|---|
| Master mold |  |  |  |  | I |  |  |  |
| Substrate | Type | PET | glass | Si wafer | sapphire | PSF | PC | PEN |
|  | Thickness (mm) | 0.125 | 1.1 | 0.5 | 0.5 | 0.12 | 0.12 | 0.12 |
| Resin layer | Type Methyl methacrylate |  |  |  | 80 |  |  |  |
|  | Silicone macromer FM-0711 |  |  |  | 20 |  |  |  |
|  | Thickness (μm) |  |  |  | 1.2 |  |  |  |
|  | Weight-average molecular weight (Mw) |  |  |  | 83,000 |  |  |  |
| 365 nm Light transmittance (%) |  |  |  |  | 82 |  |  |  |
| Contact angle to water (°) | Before imprinting | 110 | 110 | 110 | 110 | 110 | 110 | 110 |
|  | After 20-shot imprinting | 108 | 108 | 108 | 108 | 108 | 108 | 108 |
|  | Percentage change after 20-shot imprinting (%) | 1.8 | 1.8 | 1.8 | 1.8 | 1.8 | 1.8 | 1.8 |
| Nanoimprinting results | Macro examination | AA | AA | AA | AA | AA | AA | AA |
|  | SEM (frequency) | AA | AA | AA | AA | AA | AA | AA |
|  | AFM (height) | AA | AA | AA | AA | AA | AA | AA |

|  |  | Ex. 23 | Ex. 24 | Ex. 25 | Ex. 26 | Ex. 27 |
|---|---|---|---|---|---|---|
| Master mold |  |  |  | I |  |  |
| Substrate | Type | Polyimide | PMMA | DLC | GC | SiC |
|  | Thickness (mm) | 0.3 | 0.12 | 0.12 | 1.0 | 0.43 |
| Resin layer | Type Methyl methacrylate |  |  | 80 |  |  |
|  | Silicone macromer FM-0711 |  |  | 20 |  |  |
|  | Thickness (μm) |  |  | 1.2 |  |  |
|  | Weight-average molecular weight (Mw) |  |  | 83,000 |  |  |
| 365 nm Light transmittance (%) |  |  |  | 82 |  |  |
| Contact angle to water (°) | Before imprinting | 110 | 110 | 110 | 110 | 110 |
|  | After 20-shot imprinting | 108 | 108 | 108 | 108 | 108 |
|  | Percentage change after 20-shot imprinting (%) | 1.8 | 1.8 | 1.8 | 1.8 | 1.8 |
| Nanoimprinting results | Macro examination | AA | AA | AA | AA | AA |
|  | SEM (frequency) | AA | AA | AA | AA | AA |
|  | AFM (height) | AA | AA | AA | AA | AA |

Example 28

Using the resin mold for nanoimprinting of Example 1, nanoimprinting was carried out in the following manner instead of the step (4) of Example 1.

A cyclohexyl methacrylate (trade name: Light Ester CH, manufactured by Kyoeisha Chemical Co., Ltd.) polymerization product prepared in the same step as the step (1) of Example 1 was applied in advance onto a glass substrate by spin coating, and the resulting resin laminate was heated to 130° C. to prepare a transfer sheet.

The resin mold (transfer surface: 576 mm², 150 L/S, frequency: 300 nm, depth: 150 nm) prepared in Example 1 was pressed against this transfer sheet, and thermal transfer was carried out at 80° C.

In the thermal transfer, the pressure of a pressing machine was 20 MPa, and the holding time was 5 minutes.

Thereafter, the laminate was cooled to 65° C., then the resin mold was removed, and it was confirmed that there was no transfer defect. The results are set forth in Table 6.

Using the resin mold, continuous thermal nanoimprinting of 20 shots was carried out, and as a result, imprinting could be achieved without any problem.

Example 29

Using the resin mold for nanoimprinting of Example 1, nanoimprinting was carried out in the following manner instead of the step (4) of Example 1.

The resin mold for nanoimprinting obtained in Example 1 was wound round a roll having a diameter of 6 inches, and while pressing them at 1.0 MPa against a polycarbonate film (trade name: Lexan film, thickness: 0.12 mm, manufactured by Asahi Glass Co., Ltd.) having been coated with a photo-curable resin PAK-20 (manufactured by Toyo Gosei Co., Ltd.), the line was run (feed rate: 1 m/min, apparatus: handmade).

Thereafter, while running the line, irradiation with ultraviolet rays of 70 mW/cm² was carried out to cure the resin.

Subsequently, the resin mold for nanoimprinting was removed from the roll. It was confirmed that the mold was free from falling-off of resin, etc.

Falling-off of the resin from the resin mold for nanoimprinting after the nanoimprinting was visually observed, and further, the contact angle was also measured.

Moreover, the surface shape of the resin on which nanoimprinting had been performed was observed by means of SEM and AFM, and as a result, it was confirmed that a pattern having a line width of 150 nm, frequency of 300 nm and a depth of 150 nm had been formed.

The results are set forth as nanoimprinting results in Table 6.

The invention claimed is:

1. A resin mold for nanoimprinting, comprising a substrate and a resin layer formed on the substrate and having depressions and protrusions formed on a surface of the resin layer, wherein the resin layer is formed from 1 to 49 parts by weight of a macromonomer selected from the group consisting of a silicone-based macromonomer and a fluorine-based macromonomer, and 99 to 51 parts by weight of at least one polymerizable monomer selected from the group consisting of a (meth)acrylic monomer, a styrene-based monomer, an epoxy-based monomer, an olefin-based monomer and a polycarbonate-based resin-forming monomer, the macromonomer has a molecular weight of 600 to 10000 and has, at an end of molecule, a reactive group copolymerizable with the polymerizable monomer, and when the reactive group is copolymerized with the polymerizable monomer, silicone-based units and/or fluorine-based units of the macromonomer form side chains on a trunk polymer formed from the polymerizable monomer and the macromonomer, wherein the side chains of the trunk polymer are present on the surface of the resin layer so that a contact angle between the resin layer surface and pure water become not less than 100 degrees.

2. The resin mold for nanoimprinting as claimed in claim 1, wherein when a thickness of the resin layer is designated by y and a height of each protrusion formed on the resin layer is designated by x, the resin layer has a relationship represented by the following formula (I):

$$y = n \times x \quad (I)$$

wherein n is a value ranging from 1 to 15.

3. The resin mold for nanoimprinting as claimed in claim 1, wherein the macromonomer forms a chain structure comprising silicone units and/or fluorine-containing units.

4. The resin mold for nanoimprinting as claimed in claim 1, wherein a resin that forms the resin layer has a weight-average molecular weight (Mw), as measured by gel permeation chromatography, of 50000 to 150000.

5. The resin mold for nanoimprinting as claimed in claim 1, wherein a pitch of repeating units of a surface shape formed on the resin layer is in the range of 10 to 50000 nm.

6. The resin mold for nanoimprinting as claimed in claim 1, wherein a light transmittance of the resin mold for nanoimprinting at 365 nm is not less than 75%.

TABLE 6

Use example of resin mold (containing silicone macromer)

| | | | Ex. 1 | Ex. 28 | Ex. 29 |
|---|---|---|---|---|---|
| | Master mold | | | I | |
| Substrate | Type | | | PET | |
| | Thickness (mm) | | | 0.125 | |
| Resin layer | Type | Methyl methacrylate | | 80 | |
| | | Silicone macromer FM-0711 | | 20 | |
| | | Thickness (μm) | | 1.2 | |
| | Weight-average molecular weight (Mw) | | | 83,000 | |
| | 365 nm Light transmittance (%) | | | 82 | |
| Contact angle | Before imprinting | | 110 | 110 | 110 |
| to water (°) | After 20-shot imprinting | | 108 | 108 | 108 |
| | Percentage change after 20-shot imprinting (%) | | 1.8 | 1.8 | 1.8 |
| | Shape of resin mold used | | UV/sheet | heat/sheet | UV/roll |
| Nanoimprinting | Macro examination | | AA | AA | AA |
| results | SEM (frequency) | | AA | AA | AA |
| | AFM (height) | | AA | AA | AA |

7. The resin mold for nanoimprinting as claimed in claim 1, wherein the substrate arranged in the resin mold for nanoimprinting is one substrate selected from the group consisting of a resin substrate, a glass substrate, a silicon substrate, a sapphire substrate, a carbon substrate and a GaN substrate.

8. The resin mold for nanoimprinting as claimed in claim 1, which is arranged on a surface of a roller.

9. The resin mold for nanoimprinting as claimed in claim 2, wherein a resin that forms the resin layer has a weight-average molecular weight (Mw), as measured by gel permeation chromatography, of 50000 to 150000.

10. The resin mold for nanoimprinting as claimed in claim 2, wherein a pitch of repeating units of a surface shape formed on the resin layer is in the range of 10 to 50000 nm.

11. The resin mold for nanoimprinting as claimed in claim 1, wherein the substrate is resin substrate in a form of a film.

* * * * *